United States Patent
Zappen et al.

(10) Patent No.: US 11,567,140 B2
(45) Date of Patent: Jan. 31, 2023

(54) METHOD AND DEVICE FOR THE DIAGNOSIS OF BATTERY CELLS

(71) Applicant: RHEINISCH-WESTFÄLISCHE TECHNISCHE HOCHSCHULE (RWTH) AACHEN, Aachen (DE)

(72) Inventors: Hendrik Zappen, Kall (DE); Alexander Gitis, Aachen (DE)

(73) Assignee: RHEINISCH-WESTFALISCHE TECHNISCHE HOCHSCHULE (RWTH) AACHEN

( * ) Notice: Subject to any disclaimer, the term of this patent is extended or adjusted under 35 U.S.C. 154(b) by 0 days.

(21) Appl. No.: 17/279,253

(22) PCT Filed: Sep. 26, 2019

(86) PCT No.: PCT/EP2019/076038
§ 371 (c)(1),
(2) Date: Mar. 24, 2021

(87) PCT Pub. No.: WO2020/064932
PCT Pub. Date: Apr. 2, 2020

(65) Prior Publication Data
US 2022/0011373 A1 Jan. 13, 2022

(30) Foreign Application Priority Data

Sep. 26, 2018 (DE) .................. 102018216517.3
Sep. 26, 2018 (DE) .................. 102018216518.1

(51) Int. Cl.
*G01R 31/392* (2019.01)
*G01R 31/389* (2019.01)
*G01R 31/388* (2019.01)

(52) U.S. Cl.
CPC ......... *G01R 31/392* (2019.01); *G01R 31/388* (2019.01); *G01R 31/389* (2019.01)

(58) Field of Classification Search
None
See application file for complete search history.

(56) References Cited

U.S. PATENT DOCUMENTS

2010/0274510 A1 10/2010 Morrison
2017/0254859 A1* 9/2017 Christophersen .... G01R 31/392

FOREIGN PATENT DOCUMENTS

DE 102009000337 7/2010

OTHER PUBLICATIONS

Yves Van&Ems P14; Ingelgem et al: "Advantages of Odd Random Phase Multisine Electrochemical Impedence Measurements". Electroanalysis, vol. 21, No. 6, Mar. 1, 2009 (Mar. 1, 2009), pp. 730-739, XP055016094, ISSN: 1040-0397, DOI: 10.1002/elan. 200804471, the whole document.

(Continued)

*Primary Examiner* — Jas A Sanghera
(74) *Attorney, Agent, or Firm* — Sand, Sebolt & Wernow Co., LPA

(57) ABSTRACT

An exciter unit, a battery system including the exciter unit, and a method for determining a battery state of at least one battery cell. The method includes: a. applying a current-exciting signal; b. recording an impedance spectrum of the battery cell; c. determining an evaluation variable on the basis of a measured impedance spectrum. At least one of the amplitude, frequency and relative phase difference of at least one component of the current-exciting signal is modified as a function of the first measured response signal such that a measuring error is minimized, a further measured response signal is determined and evaluated, the value evaluated is used as an evaluation variable, and the battery state variables of the battery cell are determined on the basis of a compari- (Continued)

son of at least one diagnostic variable with at least one reference value and/or with at least one further diagnostic variable.

19 Claims, 6 Drawing Sheets

(56) References Cited

OTHER PUBLICATIONS

Van Gheem E et al: "Electrochemical impedance spectroscopy in the presence of non-linear distortions and non-stationary behaviour", Electrochimica Acta, Elsevier, Amsterdam, NL, vol. 49, No. 26, Oct. 15, 2004 (Oct. 15, 2004), pp. 4753-4762, XP027193659, ISSN: 0013-1686 [retrieved on Jul. 24, 2004], the whole document.

Ciucci Francesco et al: "Analysis of Electrochemical Impedance Spectroscopy Data Using the Distribution of Relaxation Times: A Bayesian and Hierarchical Bayesian Approach", Electrochimica Acta, Elsevier, Amsterdam, NL, vol. 167, Mar. 20, 2015 (Mar. 20, 2015), pp. 439-454, XP029158615, ISSN: 0013-1686, DOI: 10.1016/J. Electacta, 2015.03.123, the whole document.

Hendrik Zappen et al: "Application of Time-Resolved Multi-Sine Impedance Spectroscopy for Lithium-Ion-Battery Characterization", Batteries, vol. 4, No. 4, Dec. 1, 2018 (Dec. 1, 2018), p. 64, XP055654773, DOI: 10.3390/batteries4040064 Abschnitt 4., 6. und 7.; figure 5.

Kiel M et al: "Harmonic analysis for identification of nonlinearities in impedance spectroscopy", Electrochimica Acta, Elsevier, Amsterdam, NL, vol. 53, No. 25, Oct. 30, 2008 (Oct. 30, 2008), pp. 7367-7374, XP023520819, ISSN: 0013-1686, DOI: 10.1016/J. Electacta, 2008.01.089 [retrieved on Feb. 8, 2008] Abschnitt 6.1 and 6.2.

\* cited by examiner

METHOD AND DEVICE FOR THE DIAGNOSIS OF BATTERY CELLS

FIELD OF THE INVENTION

The invention relates to a method for the diagnosis of critical changes, in particular pressure changes, gas developments and temperature changes in battery cells, an excitation unit for carrying out the method, a battery system comprising such an excitation unit, a device for carrying out the method, and to a battery system comprised of such a device.

BACKGROUND OF THE INVENTION

The use of electrical or electronic devices, especially portable devices, often depends on electrochemical battery cells as a power supply, so-called "battery cells" or "batteries". Batteries can be used in electronic devices such as telecommunication devices (for example, cell phones, tablets, and computers), transportation devices (for example, cars, airplanes, and boats), and also in non-portable devices such as storage systems for centralized and distributed power supplies.

Due to external operating conditions of battery cells, such as excessive current during charging and discharging, excessive mechanical forces on the cell housing or on the contacts, overcharging or deep discharging or too high and too low cell voltage, or too high and too low cell temperatures, the electrochemical equilibrium in the battery cell shifts and the battery cell may enter a critical battery state. In addition, the battery cell may also enter critical states due to degradation mechanisms caused by aging. The critical battery state can lead to capacity losses, increased internal resistance, or exothermic processes. These, in turn, can pose hazards not only to the equipment but also to people. Early detection is therefore desirable in order to be able to be able to take countermeasures before these batteries pose a hazard.

The use of electrochemical impedance spectroscopy as a diagnostic method for detecting operating parameters (e.g. state of charge (SOC), capacity, internal resistance (SOH), temperature, and others) or safety parameters (e.g. detection of lithium plating in lithium-based battery cells or gas formation) requires that the method can be used in virtually any operating conditions of a multi-cell battery storage system and also supports continuous monitoring. The state of the art of impedance spectroscopy is exemplified in DE 10 2009 000 337. This method leads to unusable results if it is performed during dynamic operation of the battery with different charging and discharging currents.

The application US/2017/0254859 A1 discloses a device, system, and method for measuring the impedance of a test battery using an auto-ranging mode to adapt the amplitude, and a measurement mode.

The application US/2010/0274510 A1 discloses a method for measuring the frequency response using octave signals.

The publication Zappen et al., 2018, DOI:10.3390/batteries4040064 describes the application of time-resolved impedance spectroscopy for battery characterization.

The publication Kiel et al., 2009, DOI:10.1016/J.ELECTACTA.2008.01.089 describes a method for harmonic analysis of the voltage response for impedance spectroscopy for an excitation current signal comprising of a single fundamental frequency.

It would therefore be desirable to have a diagnostic option available that does not damage the battery cell and does not have the disadvantages of the prior art.

According to the invention, this task is solved by providing a method for determining a battery condition of at least one battery cell comprised of the following steps:

a) application of a current excitation signal to the battery cell;

b) recording a response measurement signal and determining the impedance spectrum of the battery cell or the impedance of the battery cell;

c) determining at least one evaluation quantity based on the measured impedance spectrum or the impedance;

a. so that the current excitation signal consists of at least two periodic signals with mutually different frequencies, that the average value of the current excitation signal is zero over at least one period of the smallest frequency contained, that a first response measurement signal of the battery cell is evaluated b. or that at least at one frequency at least one diagnostic variable from the impedance is determined and evaluated in such a way that at least one of the parameters amplitude, frequency and relative phase position of at least one component of the current excitation signal is changed as a function of the first response measurement signal to minimize a measurement error, a further response measurement signal is determined and evaluated, that the evaluated value is used as an evaluation variable and that the determination of the battery state variables of the battery cell is carried out on the basis of a comparison of at least one diagnostic variable with at least one reference value and/or with at least one further diagnostic variable.

The term battery state means in particular an operating, safety, or aging state, in particular state of charge (SOC), state of health (SOH), state of function (SOF) or state of safety (SOS) and/or temperature of a battery.

In addition to a single cell, the term battery cell also includes macro-battery cells consisting of multiple individual battery cells connected in parallel or series but encapsulated together and/or having a common power connection.

The response measurement signal is a voltage signal.

The feature, that at least one of the parameters amplitude, frequency, and relative phase position of at least one component of the current excitation signal is changed dependent on the first response measurement signal, involves in particular that the change or the changes occur in dependence on at least one of the evaluation values of the first response measurement signal.

For a spectrum, both continuous and non-continuous values in frequency are considered, in particular a spectrum based on a finite number of values at a finite number of frequencies, wherein the finite number of frequencies is in particular at least 2 and/or less than 100, preferably at least 5 and/or at most 50, wherein the frequencies are in particular linearly, logarithmically, quasi-logarithmically, or quasi-linearly distributed and/or in particular distributed in such a way that the frequencies are selected in such a way that in particular the 2nd and 3rd harmonics of each of the frequencies do not overlap with other selected frequencies. In particular, the frequencies are in a range from 1 Hz to 10 kHz.

At least one evaluation variable is in particular one or more of the following:

Result of a consistency check of recorded impedance spectra by means of the Kramers-Kronig relationship, in the form of a residual between measured impedance spectrum and impedance spectrum calculated from a Kramers-Kronig residual, signal-to-noise, SNR, ratio between response measurement signal and superimposed noise signals amplitude of response measurement signal, harmonic content of the response measurement signal (this is used to assess the linearity of the measurement).

On the basis of these evaluation variables, an adjustment of the current excitation signal is made in particular, in particular only, if at least one or more of a selection of the following adjustment criteria is fulfilled:

- the signal-to-noise ratio (SNR) of the response measurement signal for a single and/or several and/or all included frequencies is smaller than a predetermined value in the range from 1 to 25 dB, in particular smaller than a predetermined value in the range from 15 to 25 dB.
- the amplitude of the response measurement signal is greater than a predetermined value in the range from 5 to 60 mV, in particular greater than a predetermined value in the range from 5 to 20 mV, the harmonic content is greater than a predetermined value in the range in the range from 0.5 to 8%, in particular greater than a predetermined value in the range from 0.5 to 3%.
- the Kramers-Kronig residual is greater than a predetermined value in the range of 0.2 to 3%, in particular greater than a predetermined value in the range from 0.2 to 0.8%. This indicates a violation of the time invariance condition.

[0029] Further, it is convenient to iteratively change only two of the three parameters of amplitude, frequency, and relative phase.

Even if no adjustment is required according to the above adjustment criteria, further optimization of the excitation current signal may be performed. For example, the addition of frequency components and/or signal components with further frequencies, to obtain a more complete impedance spectrum.

A frequency point refers to a single frequency.

The adaptive control for adjusting the current excitation signal adjusts the current excitation signal based on the determined evaluation quantities, in particular as follows:

If the SNR of a frequency point is too low, in particular lower than specified in the predetermined adaptation criterion or multiple criteria, increase excitation amplitude of the signal of this frequency point, in particular by a value in the range of 5 to 30%, if the amplitude of the response measurement signal is not yet too high, and the linearity criteria are met. Otherwise: Either remove the signal component of this frequency point from the excitation signal or apply optimization of the phase positions of the signal components by means of suitable nonlinear optimization methods (for example like downhill simplex optimizers) to obtain a lower crest factor of the current excitation signal.

If the SNR of a frequency point is too high: reduce the excitation amplitude of the signal component of this frequency point, in particular by a value in the range of 5 to 30%.

If the amplitude of the response measurement signal is too high: reduce the amplitudes of the signal components, in particular evenly, or starting with the signal component with the best signal-to-noise ratio, in particular by a value in the range of 5 to 30%, or remove individual signal components.

If the harmonic content is too high: reduce the excitation amplitude of all signals, in particular by a value in the range of 5 to 30% and/or optimize the phase positions of the signal components to obtain a lower crest factor of the current excitation signal. If the Kramers-Kronig residual is too high: remove the signal component of lowest frequency from the current excitation signal. If none of the adjustment criteria are fulfilled: Advantageously, more signal components with other frequencies are added to obtain a more complete impedance spectrum, in particular until the number of signal components is in the range of 10 to 30.

The diagnostic quantity is in particular one of or more of or determined by including one or more of the following quantities:

- characteristic quantities of the impedance such as real part, imaginary part, magnitude and phase of a single battery cell and/or the gradient of one or more of these quantities over at least two, in particular a plurality, (excited) frequencies, in which case at least two impedances are to be determined, in particular a plurality.
- statistical quantities of the impedance, in particular the mean value and the measures of dispersion for the parameter real part, imaginary part, magnitude and phase of a plurality of battery cells connected in series and/or in parallel.
- A comparison of characteristic values of impedance such as real part, imaginary part, magnitude, and phase of a single battery cell with values from the same time step for a single battery cell or for several serially and/or parallel connected battery cells.
- A comparison of characteristic quantities of impedance such as real part, imaginary part, magnitude, and phase of a single battery cell with quantities from at least one previous time step for a single battery cell or for multiple battery cells connected in series and/or in parallel.
- A comparison of characteristic quantities of impedance such as real part, imaginary part, magnitude and phase of a single battery cell with quantities from at least one previous measurement for a single battery cell or for a plurality of battery cells connected in series and/or in parallel
- A comparison of statistical quantities of impedance, in particular mean value, and measures of dispersion for the parameter real part, imaginary part, magnitude, and phase with quantities from the same time step for a single battery cell or for several serially and/or parallel connected battery cells.
- A comparison of statistical quantities of impedance, in particular the mean value and measures of dispersion for the parameter real part, imaginary part, magnitude, and phase with quantities from at least one previous time step for a single battery cell or for several serially and/or parallel connected battery cells.
- comparison of statistical quantities of the impedance, in particular the mean value and the measures of dispersion for the parameter real part, imaginary part, magnitude, and phase with quantities from at least one previously performed measurement for a single battery cell or for several serially and/or parallel connected battery cells.
- characteristic quantities of the relaxation time spectrum, such as value of global maximum, frequency of the global maximum, the values of the local and/or global maxima, the frequency of the local and/or global maxima, number of maxima, distribution of maxima in the spectrum, difference of relaxation times with respect to maxima of a distribution function of polarization resistances, the mean value of the maxima, the centroid of the spectrum, the value of the spectrum at a certain frequency, the value of the integral of the spectrum over a certain frequency range, the integral values over several delimited frequency ranges, and the mean value of the integrals over one or more delimited frequency ranges.

Statistical quantities of the relaxation time spectrum, in particular mean value and measures of dispersion for the value of the global maximum, frequency of the global maximum, values of the local and/or global maxima, frequency of the local and/or global maxima, number of maxima, distribution of the maxima in the spectrum, difference of the relaxation times with respect to the maxima of a distribution function of polarization resistances, the mean value of the maxima, the centroid of the spectrum, the value of the spectrum at a particular frequency, the value of the integral of the spectrum over a particular frequency range, the integral values over several delimited frequency ranges, and the average value of the integrals over one or more delimited frequency ranges;

comparison of characteristic quantities of the relaxation time spectrum such as value of the global maximum, frequency of the global maximum, the values of the local and/or global maxima, the frequency of the local and/or global maxima, number of maxima, the distribution of maxima in the spectrum, the difference of the relaxation times with respect to the maxima of a distribution function of polarization resistances, the mean value of the maxima, the centroid of the spectrum, the value of the spectrum at a particular frequency, the value of the integral of the spectrum over a particular frequency range, the integral values over a plurality of delimited frequency ranges, and the average value of the integrals over one or more delimited frequency ranges with quantities from the same time increment for a single battery cell or for a plurality of series and/or parallel connected battery cells;

comparison of characteristic quantities of the relaxation time spectrum such as value of the global maximum, frequency of the global maximum, the values of the local and/or the global maxima, the frequency of the local and/or the global maxima, number of maxima, distribution of the maxima in the spectrum, the difference of the relaxation times with respect to the maxima of a distribution function of polarization resistances, the mean value of the maxima, the centroid of the spectrum, the value of the spectrum at a particular frequency, the value of the integral of the spectrum over a particular frequency range, the integral values over a plurality of delimited frequency ranges, and the average value of the integrals over one or more delimited frequency ranges with quantities from at least one previous time step for a single battery cell or for a plurality of battery cells connected in series and/or in parallel.

A comparison of characteristic quantities of the relaxation time spectrum such as value of the global maximum, frequency of the global maximum, the values of the local and/or global maxima, the frequency of the local and/or global maxima, number of maxima, distribution of maxima in the spectrum, difference of relaxation times with respect to maxima of a distribution function of polarization resistances, the mean value of the maxima, the centroid of the spectrum, the value of the spectrum at a particular frequency, the value of the integral of the spectrum over a particular frequency range, the integral values over a plurality of delimited frequency ranges, and the average value of the integrals over one or more delimited frequency ranges with quantities from at least one previously performed measurement for a single battery cell or for a plurality of battery cells connected in series and/or in parallel;

A comparison of statistical quantities of the relaxation time spectrum, in particular the mean and measures of dispersion for the parameters, value of the global maximum, frequency of the global maximum, the values of the local and/or global maxima, the frequency of the local and/or global maxima, number of maxima, distribution of maxima in the spectrum, the difference of the relaxation times with respect to the maxima of the distribution function of the polarization resistances, the average value of the maxima, the centroid of the spectrum, the value of the spectrum at a certain frequency, the value of the integral of the spectrum over a specified frequency range, the integral values over a plurality of delimited frequency ranges, and the average value of the integrals over one or more delimited frequency ranges with quantities from the same journal for a single battery cell or for a plurality of battery cells connected in series and/or in parallel;

comparison of statistical quantities of the relaxation time spectrum, in particular mean value and scattering measures for the parameter, value of the global maximum, frequency of the global maximum, the values of the local and/or global maxima, the frequency of the local and/or global maxima, number of maxima, distribution of the maxima in the spectrum, difference of the relaxation times with respect to the maxima of the distribution function of the polarization resistances, the mean value of the maxima, the centroid of the spectrum, the value of the spectrum at a determined frequency, the value of the integral of the spectrum over a particular frequency range, the integral values over a plurality of delimited frequency ranges, and the average value of the integrals over one or more delimited frequency ranges with quantities from at least one previous time step for a single battery cell or for a plurality of series and/or parallel connected battery cells;

comparison of statistical quantities of the relaxation time spectrum, in particular mean value and dispersion measures for the parameter, value of the global maximum, frequency of the global maximum, the values of the local and/or the global maxima, the frequency of the local and/or the global maxima, number of maxima, the distribution of the maxima in the spectrum, the difference of the relaxation times with respect to the maxima of the distribution function of the polarization resistances, the mean value of the maxima, the centroid of the spectrum, the value of the spectrum at a certain frequency, the value of the integral of the spectrum over a specified frequency range, the integral values over a plurality of delimited frequency ranges, and the average value of the integrals over one or more delimited frequency ranges with quantities from at least one previously performed measurement for a single battery cell or for a plurality of battery cells connected in series and/or in parallel.

The term quantity includes, in particular, the characteristic and/or statistical quantities.

The term comparison also includes a comparison of multiple comparisons and/or a comparison with results of one or more comparisons.

Thus, the invention particularly provides that at least one of the individual frequency components of the current excitation signal is adaptively adjusted depending on the characteristics and the operating state of the individual battery cell or the average operating state of a plurality of battery cells connected in series and/or in parallel, and the measurement error is thus minimized. According to the invention, it is provided in particular that several frequencies are excited simultaneously. Hereby the measurement time can be reduced considerably, so that under most operating conditions, a time invariance can be approximately assumed.

This multi-frequency method is designed in such a way that a continuous measurement of the instantaneous impedance of one or more battery cells is achieved by means of an excitation unit and further downstream units. For this purpose, in particular a predefined shape of the current excitation signal (excitation current shape), which may contain, for example 2 to 100, preferably 5 to 50, for example 20 suitably distributed, for example linearly or preferably logarithmically distributed, frequency components in a range of preferably 1 Hz to 10 kHz, is continuously applied to the battery cell or plurality of battery cells and in particular, is adaptively changed.

The time course of the current excitation signal to be constructed can be realized by means of superposition of any periodic oscillations, for example sinusoidal oscillations, cosine oscillations, rectangular oscillations and/or triangular sequences. This is explained below by way of example using a sine oscillation, although this can also be applied mutatis mutandis to the other oscillation forms, in particular cosine oscillations.

Sinusoidal oscillations and cosinusoidal oscillations are advantageous in order to enable a fast Fourier transformation, in particular a Goertzel transformation, during the evaluation.

In the following, the current excitation signal is exemplary described with N (natural number) superimposed sinusoidal oscillations.

$$I_{Exc}(t) = b * \sum_{k=1}^{N} a_k * \sin(2\pi f_k t + \phi_k)$$

Where $a_k$ is the amplitude, $f_k$ is the frequency and phase, $\Phi_k$ of the k-th component of the excitation signal. The parameter b is an additional scaling factor for the signal consisting of N frequency components. The choice of these parameters depends on the operating condition of the battery system. Typical real excitation units provide a limited total current amplitude, so depending on the choice of the individual parameters a and F of the N components, scaling is advantageous, since they also have an influence on the amplitude of the total signal. The parameter F is preferably chosen so that, as generally preferred, no constructive superposition of the oscillations occurs. The number N is selected in particular depending on which disturbances are present, since the resulting amplitude of the measurement signal per frequency point depends on this. In operating states with few disturbances (e.g. in the resting state of the battery system), for example, several frequency components are excited to obtain a more complete spectrum.

In operating states with many disturbances (e.g., in dynamic operation), for example, fewer frequency components are excited to quickly obtain particularly relevant sections of the impedance spectrum. The choice of frequency points (parameter f) depends in particular on which effects are to be observed in the spectrum. For example, cathode- or anode-side effects are typically observed at different frequencies, as well as effects that influence for example, the Solid Electrolyte Interphase, SEI, of a lithium-ion battery cell. The invention further relates to an excitation unit for carrying out the method, comprising a storage capacitor, a bi-directional power electronic converter, and a filter with means for charging the storage capacitor prior to the start of a measurement, wherein the storage capacitor provides energy for impressing a zero-mean current excitation signal on one or more battery cells by means of the bidirectional power electronic converter, so that energy can be cyclically shifted between storage capacitor and battery. In particular, the unit also comprises of means for controlling the execution of the method and/or a computing unit for calculating the at least one impedance, evaluation quantity, and/or diagnostic quantity and/or for performing the comparison and/or the adaptive control.

A possible embodiment of an excitation unit comprises a storage capacitor, a bi-directional power electronic converter, and a filter. The included storage capacitor must be charged prior to the start of the measurement and provides the necessary energy to generate a zero-mean current excitation signal by means of the bi-directional, power electronic converter to one or more battery cells. Thus, energy is cyclically shifted between the storage capacitor and the battery. Through this, only the losses in the excitation unit have to be compensated. This can be done either by permanently superimposing a small amount of DC current, which causes the excitation signal construction, however, is no longer completely zero-mean. In some circumstances, however, this may be tolerable if the battery is in an operating state that allows this anyway.

Alternatively, the storage capacitor may be cyclically recharged. This embodiment of an excitation unit also offers the advantage that overcharging of the battery is technically excluded.

In applications, for example in electrically powered vehicles, frequently changing operating and environmental conditions are present, such as widely varying temperatures, inhomogeneous states of charge or aging of the battery cells, or electrical disturbances. Therefore, the excitation unit and the characteristics of the excitation current for impedance measurement should be very robust. The robustness can be achieved by adaptive state of the excitation signal. This concerns the included frequencies, relative phase positions, and/or amplitudes of the individual frequency components, and the amplitude scaling of the superimposed overall signal.

By dynamically adjusting the contained frequency components, the influence of frequency ranges in which transient disturbances are present is minimized. This also requires a dynamic adjustment of the relative phase positions of the frequency components to obtain an overall signal with preferably lowest possible crest factor. This reduces the necessary peak power of the excitation circuit, and minimizes the disturbing influence of nonlinearities of the device under test (the battery cell). At the same time, or independently, the amplitude of the individual frequency components is also matched to the device under test and the external conditions. Since the magnitude of the impedance is frequency-dependent, the excitation amplitude is dynamically reduced at frequencies with impedances of larger magnitude, in order to achieve a dynamically specified set point for the SNR of the measurement signal. This reduces both the required excitation power and the influence of nonlinearities. Similarly, the overall amplitude of the excitation signal is scaled in the time domain. These functions are implemented within an excitation control unit that generates the necessary signal for the excitation unit.

Preferably, the obtained response measurement signal (measurement signal) is then sampled by a measurement unit within a sliding evaluation window whose width corresponds to the period of the lowest contained frequency, or an integer multiple thereof. This may be, for example, a simple rectangular window, or it may be more specialized embodiments that perform weighting on the individual sampling values.

A preferred embodiment of the invention is characterized in that adaptive compensation of charging and discharging currents in the response measurement signal, also called drift correction, which occur due to real battery operation, such as during driving of an electric vehicle, is performed. Adaptive compensation of charge and discharge currents in the response measurement signal, in particular, is performed by comparing the voltage of the response measurement signal at a time $t_0$ and a time $t=t_0+N \cdot T$, where T is the period of the smallest frequency component, and N is an integer.

The second time point is shifted by the period of the smallest frequency component contained, or a multiple thereof, with respect to the first time point. A correction signal can then be generated from the obtained values by means of an interpolation, which is applied to the values of the response measurement signal recorded within the measurement window in order to compensate the voltage change caused in the measurement signal by the superimposed charging or discharging current.

Another preferred embodiment of the invention is characterized in that instantaneous impedances of one or more frequencies are determined from the current excitation signal and voltage measurement signal within a measurement time window. The sequence of impedances is referred as an impedance spectrum.

A preferred embodiment of the invention is characterized by the fact that the impedance spectrum or the impedance spectra are checked for their quality characteristics by means of a Kramers-Kronig relation and/or further parameters, in particular consistency of at least one of the following parameters: Signal-to-noise ratio amplitude of the response measurement, signal linearity of the impedance spectrum, and time invariance of the response measurement signal.

The impedance values of n battery cells at k frequencies for a time to can be represented in matrix form:

$$\underline{A}(t_0) = \begin{bmatrix} \underline{Z}_{C_1}^{f_1} & \cdots & \underline{Z}_{C_1}^{f_k} \\ \vdots & \ddots & \vdots \\ \underline{Z}_{C_n}^{f_1} & \cdots & \underline{Z}_{C_n}^{f_k} \end{bmatrix}$$

To determine the battery condition, the recorded impedance spectra are advantageously further processed in the diagnostic unit.

The processing of the recorded impedance, in particular of the impedance spectrum, is carried out in particular by statistical methods and/or by evaluating deterministic variables.

In the determination of the battery condition, in particular of a first battery cell, quantities from the impedance spectrum, for example the real part, the imaginary part, magnitude, and/or phase angle for one or more of the excited frequencies, are used for diagnosis as follows.

For example, the real part of a battery cell C1 at an arbitrary excited frequency, hereinafter referred to as $f_k$, in the time window T $Re(\underline{Z}_{C_1}^{f_k}(t=T))$ is used. In particular, it is assumed that a previous consistency check has evaluated all impedance spectra used for subsequent evaluation as valid.

Step 1: Form the parameter absolute change, kt, of the current value real part of the battery cell C1 to be diagnosed with the value from the previous measurement time window T−1: $k_t(C_1, f_k, T) = Re(\underline{Z}_{C_1}^{f_k}(t=T)) - Re(\underline{Z}_{C_1}^{f_k}(t=T-1))$ Step 2: Determine a measure of dispersion, for example the standard deviation, $\sigma$, of $Re(\underline{Z}_{C_1}^{f_k}(t=T))$ or of $k_t$ within the past 10 measurement time windows.

Criterion 1: $|k_t(C_1, f_k, T)| > 2\sigma$ is satisfied, then a first criterion for detecting a battery state change is met.

Step 3: Determine the mean value $M_{ges}$ and a measure of dispersion, for example standard deviation $\sigma_{ges}$ of R(Z) at frequency $f_k$ of all other N cells except cell C1 in the battery system in time window T and T−1.

Criterion 2: If $\underline{Z}_{C_1}^{f_k}(t=T) > M_{ges}(t=T) + 2\sigma_{ges}(t=T-1)$ or $\underline{Z}_{C_1}^{f_k}(t=T) < M_{ges}(t=T) + 2\sigma_{ges}(t=T-1)$ outside the band $M_{ges}(t=T) \pm 2\sigma_{ges}(t=T)$, a second criterion for detecting a battery state change is met.

Criterion 3: If $Re(\underline{Z}_{C_1}^{f_k}(t=T)) > M_{ges}(t=T-1) + 2\sigma_{ges}(t=T-1)$ or $Re(\underline{Z}_{C_1}^{f_k}(t=T)) > M_{ges}(t=T-1) - 2\sigma_{ges}(t=T-1)$ was in the last time step within the band $M_{ges}(t=T) \pm 2\sigma_{ges}(t=T)$, a third criterion for detecting a battery state change is satisfied.

If at least two of the three criteria are met, a new measurement and subsequent determination of the battery condition shall be made immediately. If at least two criteria are then still fulfilled, a change in the battery state can be assumed to have been detected and, in particular, a warning signal WA ("battery state change detected") can be output.

If, $$\frac{k_t(C_1, f_k, T+1) - k_t(C_1, f_k, T)}{k_t(C_1, f_k, T)} > \frac{k_t(C_1, f_k, T) - k_t(C_1, f_k, T-1)}{k_t(C_1, f_k, T-1)} * C > 0$$

in particular an accelerating process of increasing real part is present, and a warning signal WB ("critical battery condition") can be output. C is a factor which typically lies between 1 and 1.5.

For an additional increase in confidence, the same procedure can still be carried out in parallel with one or more further excited frequency points f, and a change in the battery state can be assumed to have been detected and/or a warning signal WA or WB can be output only when the criteria are met for a predetermined plurality or for all of the frequency points.

In statistical processing, characteristics of the recorded spectra are calculated over all battery cells at their respective frequencies. This provides a measure of the inhomogeneity of the battery pack as well as the individual battery's contribution to the inhomogeneity.

A preferred embodiment of the invention is characterized by the fact that mean values and/or measures of dispersion are formed from the measured impedances, in the respective measurement time window at different frequencies and for different battery cells.

The mean value is preferably the arithmetic, geometric and/or quadratic mean. The mean can also be median or the central value. The measure of dispersion around the arithmetic mean is preferably the variation, variance, standard deviation, and/or mean absolute deviation.

The measure of dispersion around the median is preferably the quartile distance, the interquartile distance, the mean absolute deviation with respect to the median, and/or the median of the absolute deviations.

The measure of dispersion around the geometric mean is preferably the geometric standard deviation.

The characteristic quantities of the impedance, preferably the real part, imaginary part, magnitude and phase are compared with the quantities from the current time step for at least one single further cell and/or with the quantities of the same cell from another measurement time window and/or among several serially, and/or parallel connected battery cells of the same type. Depending on the measure of dispersion, threshold values can be defined to detect changes in the battery state, for example undesirable electrochemical processes such as electrolyte and SEI decomposition and gas formation in the battery cells.

When exceeding a certain temperature these phenomena induce irreversible changes in the impedance spectrum. If this occurs during operation in individual battery cells of the battery pack, this can be detected by comparison with unaffected battery cells. Alternatively, a spectrum artificially determined from the mean or median of the impedance values can be used for this purpose. For this purpose, the mean or median value is formed over each frequency point of the impedance spectra of two or more battery cells. The sequence of these calculated mean or median impedance values results in an additional impedance spectrum. From this, one or more diagnostic values can be derived which can then be used for comparison.

A statement about the speed of change of the spectrum can be made by differentiation over time using the spectra recorded in previous time steps (trend analysis). If fast changes are recognizable here, these can be used as an additional warning sign. Since spectra must be stored digitally for this purpose, it is advantageous to have a system that thins out the stored spectra over time to save storage space. To detect slower processes, such as cell aging, comparison with spectra determined in the laboratory is possible to draw conclusions about the type of aging phenomena occurring. Again, trend analysis over larger time ranges is useful.

A further preferred embodiment of the invention is characterized by the fact that the transmission unit passes the warning signals to a control device, which warns the user and/or initiates counter-measures based on the warning signals. Examples of possible counter-measures include reducing the electrical load on the battery cell, cooling and/or increasing the cooling of the battery cell, or shutting down the battery cell, in particular to prevent the risk of its impairment or destruction.

Another preferred embodiment of the invention is characterized by the fact that the characteristic quantities of the impedance preferably real part, imaginary part, magnitude, and phase are compared with quantities from the current time step for a single battery cell or for a plurality of battery cells connected in series and/or in parallel. If the difference between the quantities exceeds a threshold value, SA, a change in the battery state is detected and, in particular, a warning signal, WA, (battery state change detected) is transmitted to the transmission unit. If the difference between the quantities exceeds the further threshold value, SB, a warning signal, WB, (safety-critical battery condition) is passed to the transmission unit.

A further preferred embodiment of the invention is characterized in that the characteristic quantities of the impedance, preferably real part, imaginary part, magnitude, and phase are compared with quantities from at least one previous time step for a single battery cell or for a plurality of battery cells connected in series and/or in parallel. This comparison can be done, for example, by simple difference formation or also by differentiation according to time. If the difference between the quantities exceeds a threshold value, SA, a change in the battery condition is detected and, in particular, a warning signal WA (battery condition change detected) is transmitted to the transmission unit. If the difference between the quantities exceeds the further threshold value, SB, a warning signal WB (safety-critical battery condition) is transferred to the transmission unit.

A further preferred embodiment of the invention is characterized in that the characteristic quantities of the impedance preferably real part, imaginary part, magnitude, and phase are compared with quantities from at least one previously performed measurement for a single battery cell or for several battery cells connected in series and/or in parallel. This comparison can be made, for example, by means of simple difference formation or also by differentiation according to time. If the difference between the quantities exceeds a threshold value SA, a change in the battery condition is detected and, in particular, a warning signal WA (battery condition change detected) is transmitted to the transmission unit. If the difference between the characteristic quantities exceeds the threshold value, SB, a warning signal, WB, (safety-critical battery condition) is transferred to the transmission unit.

A further preferred embodiment of the invention is characterized in that the statistical quantities of the impedance: preferably the mean value and the measure of dispersion for the parameters of the real part, the imaginary part, the magnitude and the phase are compared with quantities from the current time step for a single battery cell or for multiple battery cells connected in series and/or in parallel. If the difference between the quantities exceeds a threshold value, SA, a change in the battery state is detected and, in particular, a warning signal, WA, (battery state change detected) is transmitted to the transmission unit. If the difference between the quantities exceeds the threshold value, SB, a warning signal, WB, (safety-critical battery condition) is transferred to the transmission unit.

A further preferred embodiment of the invention is characterized in that the statistical quantities of the impedance: preferably the mean value and the measures of dispersion for the parameters of the real part, the imaginary part, the magnitude and the phase are compared with quantities from at least one previous time step for a single battery cell or for multiple battery cells connected in series and/or in parallel. If the difference between the quantities exceeds a threshold value, SA, a change in the battery state is detected and, in particular, a warning signal, WA, (battery state change detected) is transmitted to the transmission unit. If the difference between the quantities exceeds the threshold, SB, a warning signal, WB, (safety-critical battery condition) is transferred to the transmission unit.

A further preferred embodiment of the invention is characterized in that the statistical quantities of the impedance: the mean value and the measures of dispersion for the parameters of the real part, the imaginary part, the magnitude and the phase are compared with quantities from at least one previously performed measurement for a single battery cell or for a plurality of battery cells connected in series and/or in parallel. If the difference between the quantities exceeds the threshold value, SA, a change in the battery condition is detected and, in particular, a warning signal, WA, (battery state change detected) is transmitted to the transmission unit. If the difference between the quantities exceeds the threshold value, SB, a warning signal, WB, (safety-critical battery condition) is transferred to the transmission unit.

A further preferred embodiment of the invention is characterized in that the result of the comparison of the characteristic quantities of impedance, preferably the real part, the imaginary part, the magnitude and the phase, is compared with the result of the comparison from at least one previous time step for a single battery cell or for a plurality of battery cells connected in series and/or in parallel. If the difference between the quantities exceeds a threshold value, SA, a change in the battery state is detected and, in particular, a warning signal, WA, (battery state change detected) is transmitted to the transmission unit. If the difference between the quantities exceeds the further threshold value, SB, a warning signal, WB, (safety-critical battery condition) is transferred to the transmission unit.

A further preferred embodiment of the invention is characterized in that the result of the comparison of the characteristic quantities of the impedance, preferably the real part, the imaginary part, the magnitude and the phase, is compared with the result of the comparison from previously performed measurements for a single battery cell or for a plurality of battery cells connected in series and/or in parallel. If the difference between the quantities exceeds a threshold value, SA, a change in the battery condition is detected and, in particular, a warning signal, WA, (battery state change detected) is transmitted to the transmission unit. If the difference between the quantities exceeds the further threshold value, SB, a warning signal, WB, (safety-critical battery condition) is transferred to the transmission unit.

A further preferred embodiment of the invention is characterized in that the result of the comparison of the statistical quantities, preferably the mean value and the scatter measures for the parameters of the real part, the imaginary part, the magnitude and the phase, is compared with the result of the comparison from at least one previous time step for a single battery cell or for a plurality of battery cells connected in series and/or in parallel. If the difference between the quantities exceeds the threshold value, SA, a change in the battery state is detected and, in particular, a warning signal, WA, (battery state change detected) is transmitted to the transmission unit. If the difference between the quantities exceeds the threshold, SB, a warning signal, WB, (safety-critical battery condition) is transferred to the transmission unit.

A further preferred embodiment of the invention is characterized in that the result of the comparison of the statistical quantities, preferably the mean value and the scatter measures for the parameters of the real part, the imaginary part, the magnitude and the phase, is compared with the result of the comparison from at least one previously performed measurement for a single battery cell or for several battery cells connected in series and/or in parallel. If the difference between the quantities exceeds the threshold value, SA, a change in the battery state is detected and a warning signal, WA, (battery state change detected) is transmitted to the transmission unit. When the difference between the quantities exceeds the threshold, SB, a warning signal, WB, (safety-critical battery condition) is transferred to the transmission unit.

In addition to or alternatively, the distribution of the relaxation time constants is determined from the excitation and response measurement signals. The distribution is also referred to as the relaxation time spectrum (RTS) of a battery. The RTS is the calculation of the distribution of relaxation time constants, also called "Distribution of Relaxation Times" (DRT). This enables a frequency-dependent separation of the loss processes of the battery cell due to the property that the Kramers-Kronig relationships are valid, and thus the impedance of a battery cell can be regarded as an infinite network of RC elements with different time constants.

Advantageously, characteristic quantities are determined from the RTS and used for the state diagnosis of the battery cell. Characteristic quantities for the relaxation time spectrum are, for example, the values of the global maximum, the frequency of the global maximum, the values of the local maxima, the frequencies of the local maxima, the number of the local maxima, the distribution of the local maxima in the spectrum, the average value of the maxima, the centroid of the RTS, the value of the RTS at a particular frequency, the value of the integral of the RTS over a particular frequency range, the values of the integrals over several delimited frequency ranges of the RTS, and/or the mean value of the integrals over one or more delimited frequency ranges. A diagnosis can then be performed analogously to the presented procedure for impedance spectra.

Advantageously, the relaxation time spectrum (RTS) from the current time step is compared for a single battery cell or for several battery cells connected in series and/or parallel.

Depending on the scattering measures, threshold values can be defined here to detect undesirable electrochemical processes (e.g. electrolyte and SEI decomposition and gas formation in the battery cells) and a change in the battery state can be detected if these values are exceeded. When a certain temperature is exceeded, irreversible changes occur in the relaxation time spectrum due to these phenomena. If this occurs in individual battery cells of the battery pack during operation, this can be detected by comparison with unaffected battery cells and a change in battery state can be detected if pre-determined deviations are exceeded. Alternatively, an artificial relaxation time spectrum consisting of mean or median values as characteristic variables can be used for this purpose.

From the analysis of the relaxation time spectra of a single battery and the comparison of the relaxation time spectra with one or more other batteries in the battery system, the diagnosis of the state of the single battery and/or the overall state of the battery system is performed. Preferably, the diagnostic unit performs the diagnostic method step.

The polarization contributions of n battery cells at k frequencies for a time to can be represented in matrix form:

$$B(t_0) = \begin{bmatrix} Y_{C_1}^{f_1} & \cdots & Y_{C_1}^{f_k} \\ \vdots & \ddots & \vdots \\ Y_{C_n}^{f_1} & \cdots & Y_{C_n}^{f_k} \end{bmatrix}$$

For the diagnosis of the operating and safety parameters mentioned at the beginning, further processing of the recorded relaxation time spectra is advantageous to generate diagnostic quantities from them. This is performed by the diagnostic unit. The diagnostic unit processes the recorded spectra in several ways:

Statistical properties of the recorded spectra over all battery cells at the respective frequencies are calculated, such as the median, the mean, or the scatter measures, like the interquartile range or standard deviation. This provides a measure of the inhomogeneity of the battery state of the battery pack.

Another preferred embodiment of the invention is characterized by the fact that the characteristic quantities of the relaxation time spectrum, preferably the value of the global maximum, the values of the global maximum, the values of the local maxima, frequency of the local maxima, the number of local maxima, the distribution of the local maxima in the spectrum, the mean value of the maxima, the centroid of the signal, the value of the spectrum at a particular frequency, the value of the integral of the spectrum over a particular frequency range, the integral values over several delimited frequency ranges, the mean value of the integrals over one or more delimited frequency ranges with quantities from the current time step for a single battery cell or for a plurality of battery cells connected in series and/or in parallel. If the difference between the quantities exceeds a threshold value, SA, a change in the battery state is detected and, in particular, a warning signal, WA, (battery state change detected) is transmitted to the transmission unit. If the difference between the quantities exceeds the further threshold, SB, a warning signal, WB, (safety-critical battery condition) is transferred to the transmission unit.

A further preferred embodiment of the invention is characterized in that the characteristic quantities of the relaxation time spectrum: preferably value of the global maximum, the frequency of the global maximum, the values of the local maxima, the frequency of the local maxima, the number of local maxima, the distribution of the local maxima in the spectrum, the mean value of the maxima, the center of gravity of the signal, the value of the spectrum at a certain frequency, the value of the integral of the spectrum over a certain frequency range, the integral values over several delimited frequency ranges, and/or the mean value of the integrals over one or more delimited frequency ranges is compared with quantities from at least one previous time step for a single battery cell or for several battery cells connected in series and/or in parallel. If the difference between the quantities exceeds a threshold value, SA, a change in the battery condition is detected and, in particular, a warning signal, WA, (battery state change detected) is transmitted to the transmission unit. If the difference between the quantities exceeds the further threshold value, SB, a warning signal WB (safety-critical battery condition) is transferred to the transmission unit.

A further preferred embodiment of the invention is characterized in that the characteristic quantities of the relaxation time spectrum: preferably the value of the global maximum, frequency of the global maximum, the values of the local maxima, frequency of the local maxima, number of local maxima, distribution of the local maxima in the spectrum, the mean value of the maxima, centroid of the signal, the value of the spectrum at a certain frequency, the value of the integral of the spectrum over a certain frequency range, the integral values over several delimited frequency ranges, and/or the mean value of the integrals over one or more delimited frequency ranges with quantities from at least one previously performed measurement, for example in a laboratory environment. This applies to a single battery cell or for a plurality of battery cells connected in series and/or in parallel. If the difference between the quantities exceeds a threshold value SA, a change in the battery state is detected and, in particular, a warning signal WA (battery state change detected) is transmitted to the transmission unit. When the difference between the characteristic quantities exceeds the threshold, SB, a warning signal, WB, (safety-critical battery condition) is transmitted to the transmission unit.

A further preferred embodiment of the invention is characterized in that the result of the comparison of the statistical quantities of the relaxation time spectrum: preferably the mean and the scatter measures for the value of the global maximum, the frequency of the global maximum, the values of the local maxima, the frequency of the local maxima, the number of local maxima, the distribution of the local maxima in the spectrum, the mean value of the maxima, the centroid of the signal, the value of the spectrum at a determined frequency, the value of the integral of the spectrum over a certain frequency range, the integral values over several delimited frequency ranges, the mean value of the integrals over one or several delimited frequency ranges is compared with quantities from the current time step for a single battery cell or for several battery cells connected in series and/or in parallel. If the difference between the quantities exceeds the threshold value, SA, a change in the battery state is detected and, in particular, a warning signal, WA, (battery state change detected) is transmitted to the transmission unit. When the difference between the quantities exceeds threshold, SB, a warning signal, WB, (safety-critical battery condition) is transferred to the transmission unit.

A further preferred embodiment of the invention is characterized in that the result of the comparison of the statistical quantities of the relaxation time spectrum: preferably the mean value and the measure of dispersion for the value of the global maximum, the frequency of the global maximum, the values of the local maxima, the frequency of the local maxima, the number of local maxima, the distribution of the local maxima in the spectrum, the mean value of the maxima, centroid of the signal, the value of the spectrum at a determined frequency, the value of the integral of the spectrum over a certain frequency range, the integral values over several delimited frequency ranges, and/or the mean value of the integrals over one or more delimited frequency ranges is compared with quantities from at least one previous time step for a single battery cell or for several battery cells connected in series and/or in parallel. If the difference between the quantities exceeds the threshold value, SA, a change in the battery state is detected and, in particular, a warning signal, WA, (battery state change detected) is transmitted to the transmission unit. If the difference between the quantities exceeds the threshold, SB, a warning signal, WB, (safety-critical battery condition) is transferred to the transmission unit.

A further preferred embodiment of the invention is characterized in that the result of the comparison of the statistical quantities of the relaxation time spectrum: preferably mean value and dispersion measures for the value of the global maximum, frequency of the global maximum, the values of the local maxima, frequency of the local maxima, number of local maxima, distribution of the local maxima in the spectrum, the mean value of the maxima, centroid of the signal, the value of the spectrum at a determined frequency, the value of the integral of the spectrum over a certain frequency range, the integral values over several delimited frequency ranges, the mean value of the integrals over one or several delimited frequency ranges is compared with quantities from at least one previously performed measurement for a single battery cell or for several battery cells connected in series and/or in parallel. If the difference between the quantities exceeds the threshold value SA, a change in the battery state is detected and, in particular, a warning signal WA (battery state change detected) is transmitted to the transmission unit. When the difference between the quantities exceeds the threshold SB, a warning signal WB (safety-critical battery condition) is transferred to the transmission unit.

A statement about the speed of change of the relaxation time spectrum can be made by differentiation over time using the spectra recorded in previous time steps (trend analysis). If rapid changes can be seen here, this can be used as an additional warning sign. Since spectra must be stored digitally for this purpose, it is advantageous to have a system that thins out the stored spectra over time to save storage space. To detect slower processes, such as cell aging, comparison with spectra determined in the laboratory is possible to draw conclusions about the type of aging phenomena occurring. Again, a trend analysis over larger time ranges is useful.

Preferably, the invention provides that at least one of the individual frequency components of the current excitation signal is adaptively adjusted depending on the characteristics and the operating state of the individual battery cell or the average operating state of a plurality of battery cells connected in series and/or in parallel to minimize the measurement error. The current excitation signal consists of at least two periodic signals with mutually different frequencies and is applied in such a way that it is mean value-free over at least one period of the smallest frequency contained such that a first response measurement signal of the battery cell is determined and evaluated. And that at least one of the parameters (e.g. amplitude, frequency, and relative phase position) of at least one component of the current excitation signal is changed as a function of the first response measurement signal such that the measurement error is minimized. Lastly, a further response measurement signal is determined and evaluated and in that the evaluated value is used as an evaluation variable.

The invention further relates to an excitation unit for carrying out the method comprising a storage capacitor, a bi-directional power electronic converter and an optional filter with the means for charging the storage capacitor prior to the start of a measurement; wherein the storage capacitor provides an energy to excite a mean value free current excitation signal with the bi-directional power electronic converter into one or more battery cells so that energy can be cyclically shifted between storage capacitor and battery. The invention further relates to a device for carrying out the method comprising a system control unit, an excitation unit, a measurement unit, an evaluation unit, an excitation control unit, a diagnostic unit and, and a transmission unit.

Advantageously, the device is characterized in that the control unit is set up for generating an excitation signal construction with suitable parameters, in particular excitation frequencies, excitation amplitudes, phase positions and an overall amplitude scaling (scaling factor), in that the excitation unit is further equipped for adaptive acquisition of the excitation signal construction, and in particular is arranged to adaptively adjust at least one of the parameters of the excitation signal construction.

The individual components, in particular the system control unit and the excitation unit, can be both individual and combined on a circuit board or combined in a single unit. The individual components may also be implemented as software units.

An advantageous further development of the device is characterized by the measuring unit (a means for recording the impedance spectrum) is set up for simultaneous acquisition and recording of the voltage measurement signal in a previously defined measurement time window from one or more simultaneously excited battery cells.

An expedient further development of the device is characterized in that the system control unit is arranged for generating an excitation signal construction of a characteristic multi-frequency periodic continuous signal defined in an excitation control unit in one or simultaneously several serially and/or parallel connected battery cells.

An advantageous further development of the device is characterized in that it includes an excitation control unit, which is arranged to determine adaptive correction parameters for the amplitudes, frequencies, and relative phase positions for the next measurement time window from the recorded voltage values and to transmit them to a control unit.

A convenient further development of the apparatus; it comprises an excitation unit for applying a current excitation signal; a means for recording an impedance spectrum of the battery cell; a means for determining an evaluation variable based on the measured impedance spectrum, characterized in that the excitation unit is designed in such a way that the current excitation signal consists of at least two periodic signals with mutually different frequencies, in that the current excitation signal can be applied in such a way that it is free of mean values over at least one period of the smallest frequency contained, in that the means for recording the impedance spectrum of the battery cell is designed in such a way in that a first response measurement signal of the battery can be determined and evaluated, and in that at least one of the parameters amplitude, in that the frequency and relative phase position of at least one of the signals can be changed as a function of the first response measurement signal at the aim of minimizing measurement error, in that a further response measurement signal is determined and evaluated, the evaluated value can be used as an evaluation variable, and in that the battery state of the battery cell is determined on the basis of a comparison of the diagnostic variable with a reference value and/or with at least one further diagnostic variable.

Description of preferred embodiments of the invention with reference to the drawings.

BRIEF DESCRIPTION OF THE FIGURES

These and other aspects of the invention are shown in detail in the figures as follows.

Figure 2:
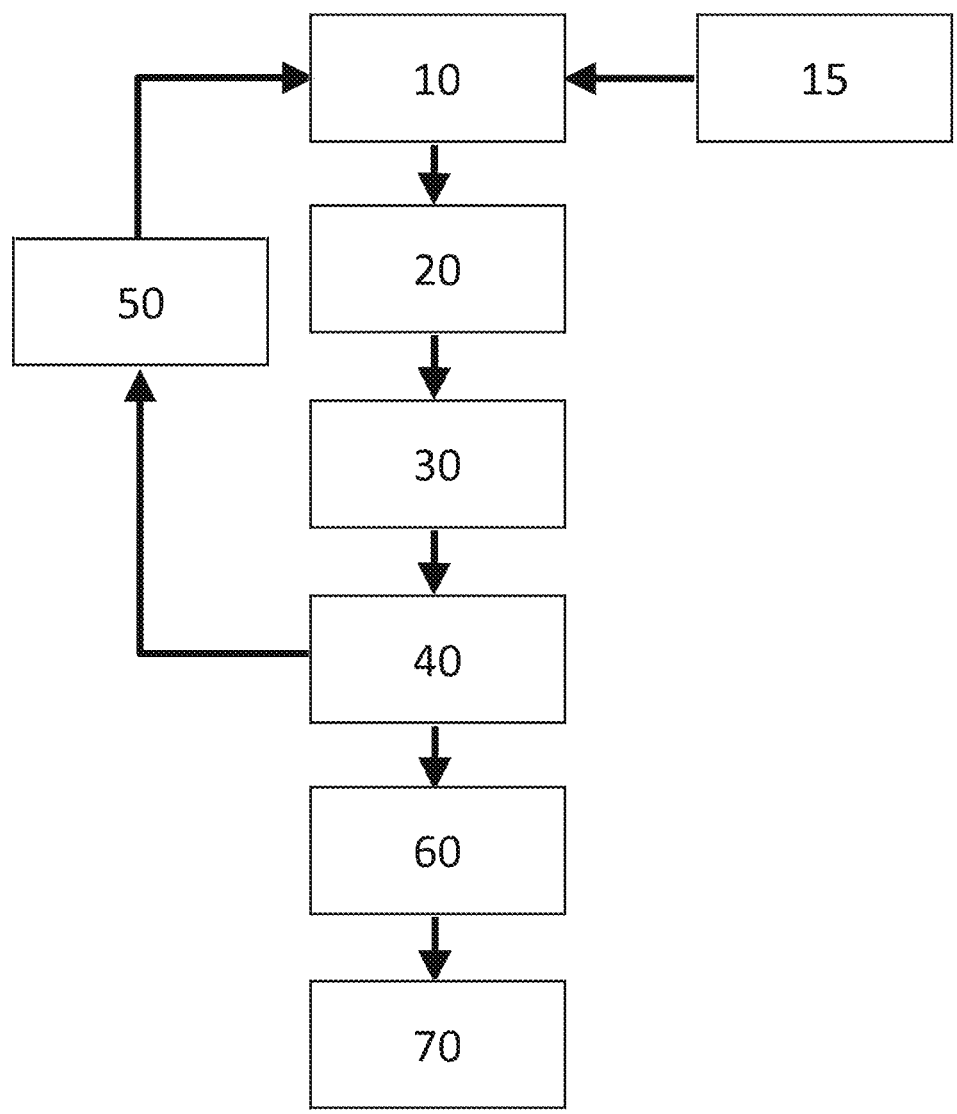
FIG. 2: Apparatus for carrying out the process according to the invention.

A possible embodiment of an advantageous device for carrying out the method of the invention process is shown in FIG. 2. It comprises a system control unit 10, a means for generating an external trigger signal 15, an excitation unit 20, a measuring unit 30, an evaluation unit 40, an excitation control unit 50, a diagnostic unit 60 and a transmission unit 70. The means for generating the external trigger signal 15 and the trigger signal 15 are optional and enable a new measurement cycle to be started as a function of external events.

Preferably, the external trigger signal 15 is transmitted via a data bus not shown.

With this device according to the invention, methods according to the invention can be carried out.

Figure 3:
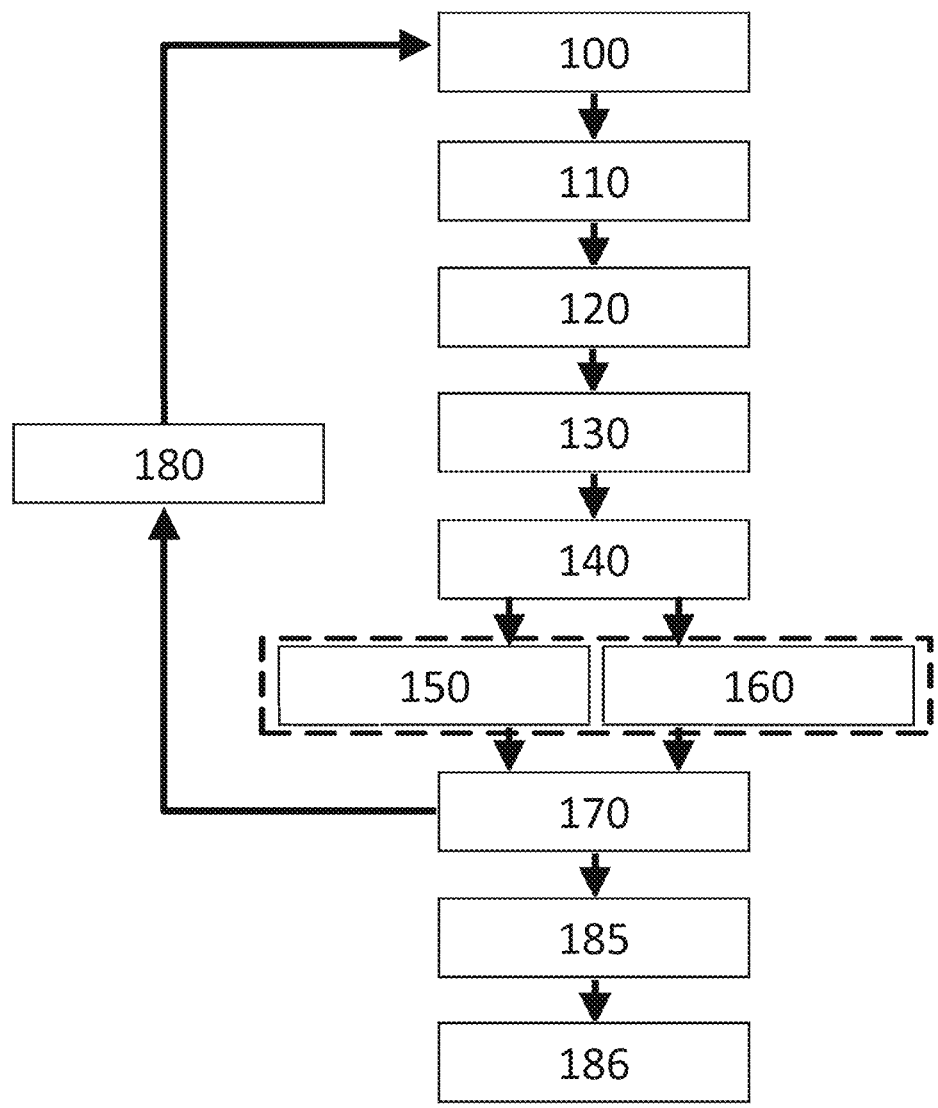
FIG. 3: Sequence of a preferred process.

A preferred implementation of the method according to the invention is explained below with reference to FIG. 3. This method is expediently carried out with the apparatus shown in FIG. 2.

An excitation signal construction 100 is carried out with suitable parameters, in particular, excitation frequencies, excitation amplitudes, phase positions, and an overall amplitude scaling (scaling factor).

A preferred embodiment of the invention allows for selecting the excitation frequencies such that they do not interfere with higher harmonics, in particular 2nd and/or 3rd. Harmonics, of other excited frequencies are overlapping.

Since in applications, for example electrically driven vehicles, frequently changing operating and environmental conditions are present, such as strongly varying temperatures, inhomogeneous states of charge or aging of the battery cells, or electrical disturbances, the excitation unit and the characteristics of the excitation current for the impedance measurement must be very robust against these influences. The latter can be achieved by adaptive acquisition of the excitation signal. This concerns the included frequencies, relative phase positions, and amplitudes of the individual frequency components and the amplitude scaling of the superimposed overall signal.

By dynamic adjustment of the contained frequency components, the influence of frequency ranges in which transient disturbances are present is minimized. This also requires a dynamic adjustment of the relative phase positions of the frequency components in order to obtain an overall signal with the lowest possible crest factor. This reduces the required peak power of the excitation circuit and minimizes the disturbing influence of nonlinearities of the device under test (the battery cell). At the same time, or independently, the amplitude of the individual frequency components is adjusted to the DUT and the external conditions. Since the magnitude of the impedance is frequency dependent, the method can be used to reduce the excitation amplitude at frequencies with impedances of larger magnitude to achieve a dynamically specified set-point for the signal-to-noise ratio of the measurement signal. This additionally reduces the necessary excitation power and the influence of nonlinearities. Similarly, in an advantageous further development of the invention, the method according to the invention allows the total amplitude of the excitation signal in the time domain can be scaled. These functions are implemented within a control unit that generates the necessary control signal for the excitation unit. In doing so, a control unit uses the data determined in the previous step by the evaluation unit, the respective set-point values for the next measurement pass are determined.

After the excitation construction 100 is performed in the control unit 10, a generation 110 of a current excitation signal is performed by the excitation unit 20. The excitation unit 20 is also referred to as a driver.

Figure 4:
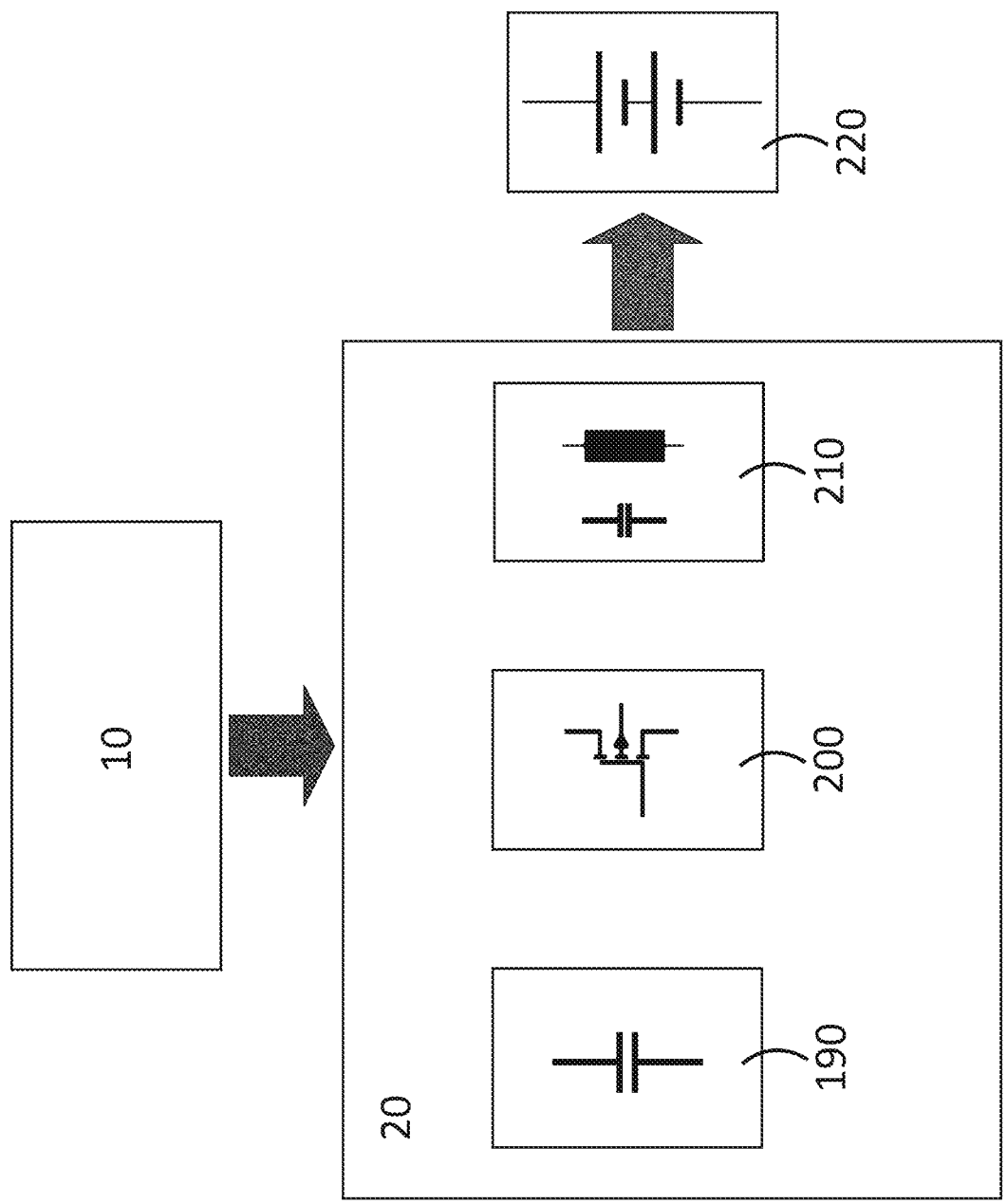
FIG. 4: Execution example for the excitation unit, consisting of a storage capacitor, a bidirectional power electronic converter, and optionally one or more filter elements

An embodiment of an excitation unit 20 according to the invention is shown in FIG. 4. It comprises a storage capacitor, a bi-directional power electronic converter, and a filter. The included storage capacitor must be charged prior to the start of the measurement and provides the energy necessary to express a zero-mean current excitation signal onto one or more battery cells by means of the bi-directional power electronic converter. Energy is thus cyclically shifted between the storage capacitor and the battery. In this way, only the losses in the excitation unit have to be compensated. This can be done either by permanently superimposing a small amount of direct current, which causes the excitation signal construction, however, is no longer completely zero mean values. Depending on the application, battery states tolerating such an excitation are possible.

Alternatively, the storage capacitor can also be cyclically recharged. This embodiment of an excitation unit also offers the advantage that overcharging of a battery can be technically eliminated. The excitation unit 20 can provide any excitation signal constructions 100 for the diagnosis 185 according to the invention. Furthermore, it is possible to use the excitation signal construction 100 according to the invention combined with any diagnosis 185. In a subsequent process step, a voltage response measurement 120 is performed, followed by a drift correction 130 and a transformation 140 into the frequency domain is performed. The frequency domain transformation 140 can advantageously be performed with the so-called Görtzel algorithm, which is a special form of the discrete Fourier transform (DFT). Compared to the better known "Fast Fourier Transform" (FFT), this has the advantage of a higher computational time efficiency, for the typical case of only comparatively few discrete spectral components exactly those which were also contained in the excitation signal are needed. Alternatively, a wavelet transform is also advantageous when non-periodic or periodic non-trigonometric excitation functions are used. In the case of voltage response measurements where the measurement signal is windowed, a wavelet transform is advantageous.

An impedance spectrum determination 150 and an optional relaxation time determination 160 are preferably performed simultaneously. It is equally possible to omit the determination 160 of the relaxation time spectrum or to perform the relaxation time determination following a consistency check 170.

The consistency check 170 enables adaptive control 180 of at least one of the parameters of the excitation signal construction 100. The consistency check is used to assess the validity of the recorded impedance spectra. A common basic requirement for electrochemical impedance spectroscopy is that the behavior of the system under study can be described as linear and time invariant. Compliance with these criteria is achieved by the consistency check.

Advantageously, the consistency check 170 is performed in several ways. In the case where a frequency spectrum of the measurement signal is available, this is examined with respect to contained harmonics of the excitation signal. If harmonics are detected, this is an indication of nonlinear behavior. Subsequently, the excitation signal is modified by the adaptive control 180 and the adapted excitation signal construction 100 until no more harmonics are detected.

Further advantageous criteria for the consistency check 170 and assessment of time-invariant behavior are the Kramers-Kronig relations (presented for example in the following publication: M. Schönleber, D. Klotz and E. Ivers-Tiffee, A Method for Improving the Robustness of linear Kramers-Kronig Validity Tests, Electrochimica Acta 131, pp. 20-27 (2014)), which relate the real and imaginary parts of the recorded impedance spectra, and check for consistency. If during the consistency check 186 a too strong deviation between measured real parts or measured imaginary parts of the impedance and impedance, respectively, constructed by means of Kramers-Kronig relations is detected, a violation of the time invariance criterion is detected and the measurement is recognized as inconsistent and discarded. A new excitation signal is constructed by the adaptive control 180 and the adapted excitation signal construction 100, and the measurement is repeated.

During a dynamic loading of the battery with a superimposed load current or charging current, the consistency check 170 of the impedance measurement is performed in addition or replacing the analysis of the current intensity. If the load current or charge current changes more than a tolerance band D during the measurement, the measurement is recognized as inconsistent because the state of the battery has changed to such an extent that there is no longer any time invariance. Depending on the current strength of the superimposed current, the adaptive control 180 and the adapted excitation signal construction 100 the low frequency components are eliminated and the measurement duration is reduced to such an extent that in the next measurement step a time-invariant behavior is again present and the necessary consistency is restored.

Another feature of the consistency check 170 in the evaluation unit 40 is an interference analysis of the measurement signal. For this purpose, for example, the signal-to-noise ratio of the measurement signal is evaluated. If a high spectral noise power density is present around the excited frequencies, this is an indication of an interference effect. Adaptive control 180 and matched excitation signal construction 100 change the at least one frequency or amplitude of the excitation signal to increase the signal-to-noise ratio.

The adaptive control 180 further processes the results of the consistency check, and defines the requirements for a new excitation signal. For example, in the next time step, the amplitude of the current excitation signal must be reduced if nonlinearities are detected. If strong disturbances are detected in certain frequency bands, a variation of the excitation frequencies takes place. If a violation of the time invariance criterion is detected, the measurement duration is adaptively shortened according to the invention by omitting low frequencies and/or incompletely detecting them.

Preferably, the evaluation unit 40 performs the method steps 130 to 170. Subsequently, the measurement data is further used for diagnosis 185. Finally, a further reduction of the required storage space 186 by thinning spectra over time.

Figure 1:
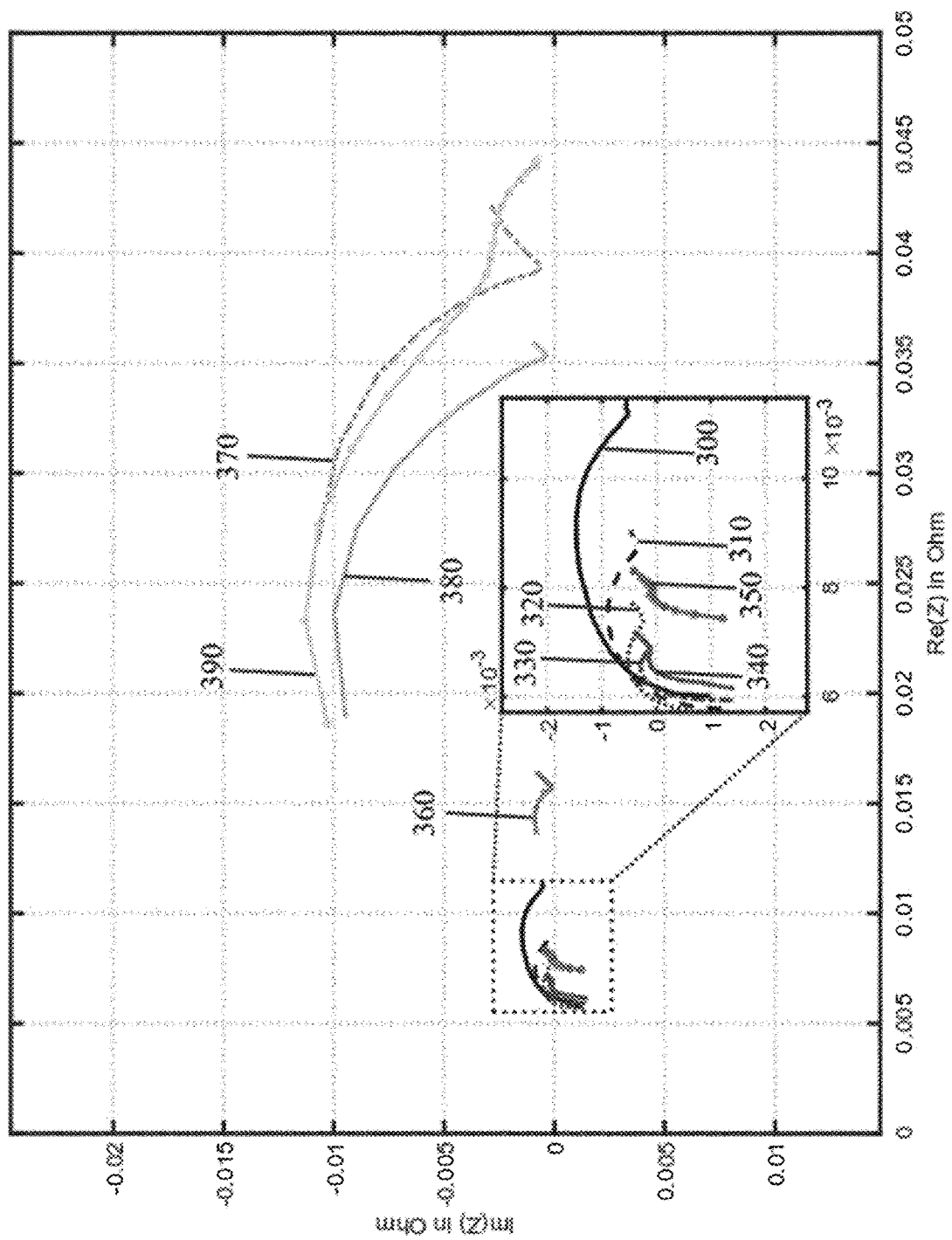
FIG. 1: A set of impedance spectra before, during, and after onset of electrolyte decomposition and gas formation.

FIG. 1 shows an array of impedance spectra of an exemplary lithium-ion battery at different temperatures. The plot is in the form of a so-called Nyquist diagram, in which the real part of the impedance is plotted on the X-axis and the negative imaginary part of the complex impedance is plotted on the Y-axis.

The impedance spectra 300-320, corresponding to a temperature range of 40° C.-60° C. exhibit normal behavior in that the charge transfer process of one or both electrodes, typically recognizable as a compressed semicircle, becomes smaller, resulting in a reduction in the losses associated with this. The impedances recorded at 70° C., 80° C., and 90° C. already show increasing conspicuities, which are expressed by an increasing shift towards larger values on the axis of the real part. This is typical for the decomposition of the electrolyte or the SEI that begins in this temperature range, and the subsequent formation of gas. At further increasing temperatures of 100° C. and 110° C. (impedance spectra 360 and 370), even stronger peculiarities become apparent, which are expressed by an indicated additional semicircle in the higher-frequency part of the spectrum in the Nyquist diagram. The impedance spectrum 380 was recorded during the following cooling phase at a temperature of 80° C., and compared to the spectrum previously recorded at the same temperature, and shows significant changes. Spectrum 390, recorded after the initial temperature of 40° C. was reached again, shows a permanent change in the impedance spectrum, signifying severe, permanent damage to the battery cell. From the analysis of the frequency spectra of an individual battery cell and the comparison of the frequency spectra with other battery cells in the battery system, the diagnosis 185 of the condition of the individual battery and/or the overall condition of the battery system is made.

Preferably, the diagnostic unit 60 performs the diagnostic 185 method step.

The impedance values of n battery cells at k frequencies for a time to can be represented in matrix form:

$$\underline{A}(t_0) = \begin{bmatrix} \underline{Z}_{C_1}^{f_1} & \cdots & \underline{Z}_{C_1}^{f_k} \\ \vdots & \ddots & \vdots \\ \underline{Z}_{C_n}^{f_1} & \cdots & \underline{Z}_{C_n}^{f_k} \end{bmatrix}$$

For the diagnosis of the operating and safety parameters mentioned at the beginning, further processing of the recorded impedance spectra is advantageous in order to generate diagnostic quantities from them. This is performed by the diagnostic unit 60. This processes the recorded spectra in several ways:

Statistical properties of the recorded spectra are calculated over all battery cells at the respective frequencies, such as median, mean or measure of dispersion such as the Interquartile range or standard deviation. This gives a measure of the inhomogeneity of the battery state of the battery pack.

The characteristic quantities of impedance (e.g. the real part, the imaginary part, the magnitude and the phase) are compared with the quantities from the current time step for a single battery cell or for several battery cells connected in series and/or parallel. Depending on the scattering measures, threshold values are defined to detect undesired electrochemical processes, such as electrolyte and SEI decomposition and gas formation in the battery cells. As already explained with reference to FIG. 1, irreversible changes in the impedance spectra 380 and 390 result from degeneration phenomena when a certain temperature is exceeded. By comparing the spectra between different battery cells of the battery pack, an affected battery cell or multiple affected battery cells can be identified. For example, if battery cell A has spectrum 330 and battery cell B has spectrum 350, diagnostic unit 60 is able to identify battery cell B as a defective battery.

Alternatively, a spectrum artificially determined from mean and/or median of the impedance values will be used for the comparison. Alternatively or additionally, impedance spectra from previously performed measurements, for example under laboratory conditions, are used as a reference for the comparison.

A statement of the change rate of the spectrum over time is also used for diagnosis 185. By differentiating over time, a diagnosis is also made using spectra recorded in one or more previous time steps. The process is also referred to as trend analysis. If rapid changes are detected here, this is used in addition or as some indicator for diagnosis 185 of a critical condition. Alternatively or supplementarily, statistical quantities of the impedance spectra, such as mean values and/or measure of dispersion are used for the trend analysis. Alternatively or supplementally, trends from previously performed measurements, for example under laboratory conditions, are used as reference.

Alternatively or complementarily, for the detection of slow processes, such as cell aging, a comparison with impedance spectra determined in the laboratory is provided to draw conclusions about the type of aging phenomena occurring. Here, a trend analysis over a larger time range is useful.

The determination 160 of the relaxation time is the calculation of the distribution of the relaxation time constants, also called "Distribution of Relaxation Times" (DRT). The distribution is also called the relaxation time spectrum (RZS) of a battery. This allows a frequency-dependent separation of the loss processes of the battery cell due to the property that the Kramers-Kronig relations are valid, and thus the impedance of a battery cell can be understood as an infinite network of RC links with different time constants.

Figure 5:
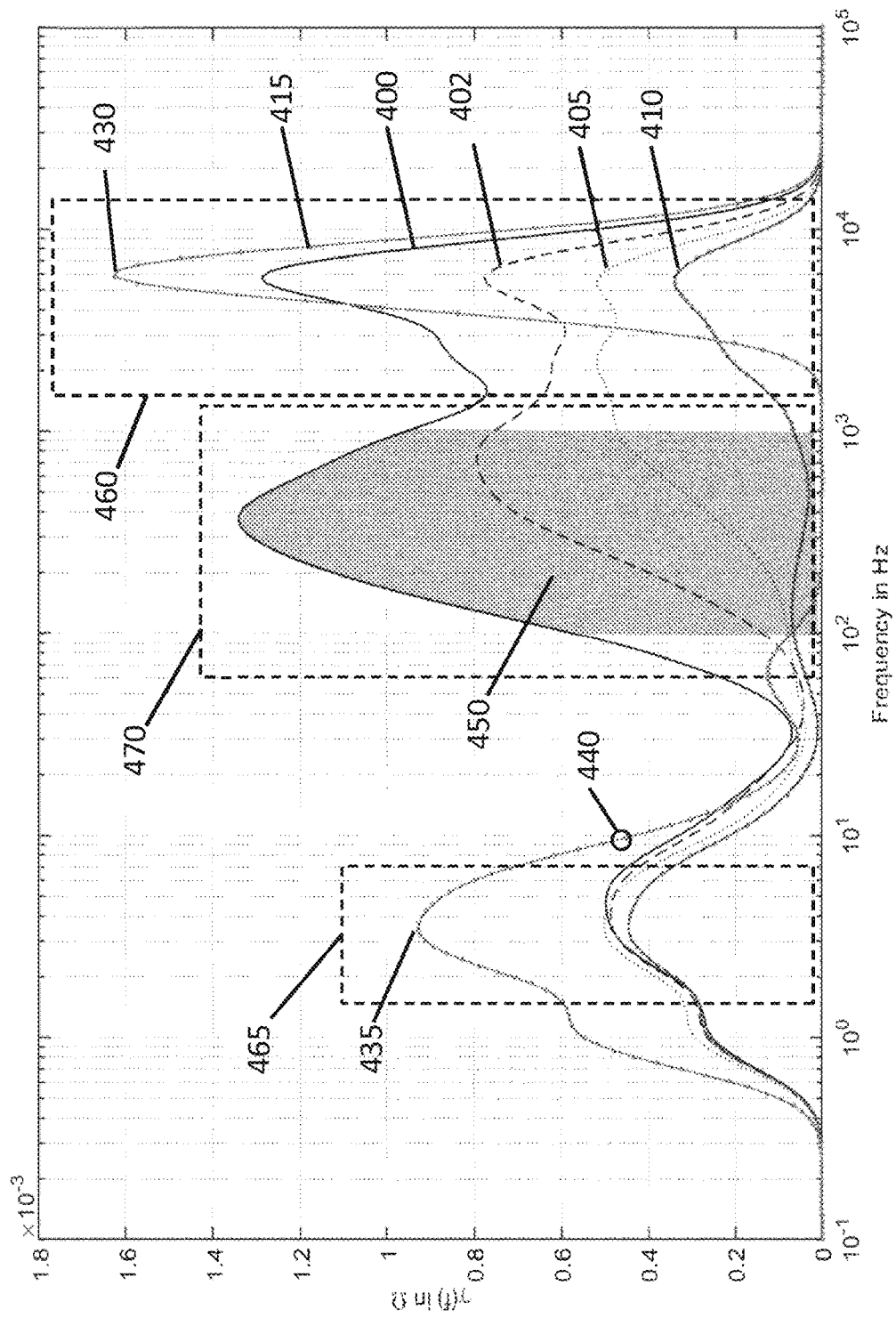
FIG. 5: A set of relaxation time spectra before and during the onset of electrolyte decomposition and gas formation.

In FIG. 5, a set of relaxation time spectra of an exemplary lithium-ion battery at different temperatures is shown. The frequency is plotted on the x-axis, which is inversely proportional to the relaxation time. The magnitude of the distribution function of the polarization resistances is plotted on the Y axis, which are proportional to the loss processes in the battery cell.

The relaxation time spectra 400 and 402, corresponding to a temperature range of 40° C.-50° C. show normal behavior in that in this example three typical relaxation processes 460, 465, and 470 are discernible. As the temperature rises to 60° C. 405 and 80° C. 410, when the first safety-critical processes begin, process A 460 and process C 470 become significantly smaller. These conspicuous features indicate the first safety-relevant processes in the battery cell, such as the decomposition of the electrolyte or SEI, and the subsequent formation of gas.

Figure 6:
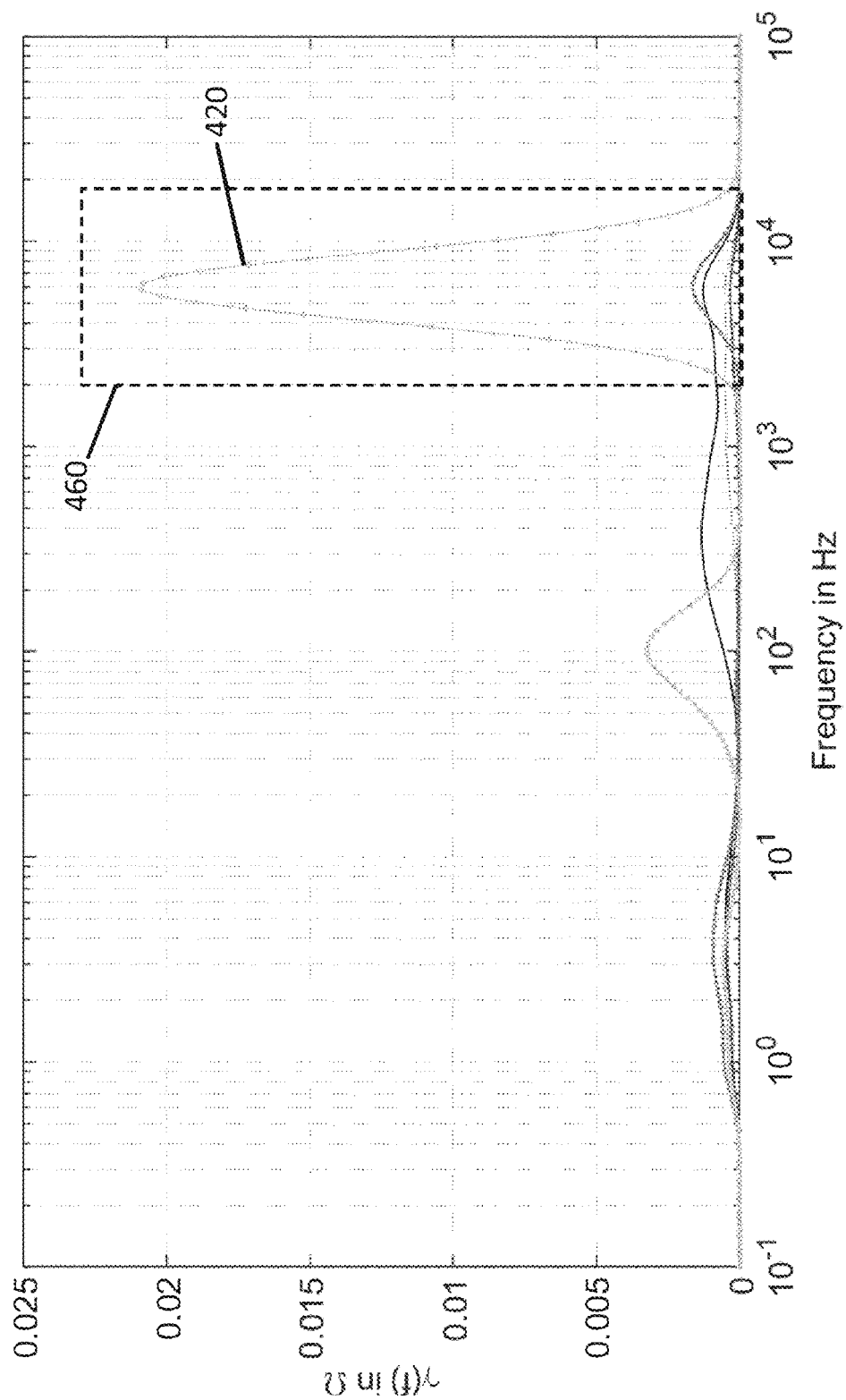
FIG. 6: A relaxation time spectrum after the onset of electrolyte decomposition and gas formation, compared with the relaxation time spectra before and during the onset of electrolyte decomposition and gas formation.

As temperatures continue to rise to 100° C. 415, even stronger conspicuous features become apparent, which are reflected in an absolute dominance of the relaxation process A 460 in the spectrum 415. FIG. 6 shows the relaxation time spectrum 420 of a battery at a temperature of 40° C. after cooling down from 110° C. The spectrum 420, recorded after the initial temperature of 40° C. has been reached again, shows a permanent change in the distribution of the [0302] relaxation times constants and the absolute dominance of the relaxation process A 460 even after the battery has cooled, indicating severe, permanent damage to the battery cell. From the analysis of the relaxation time spectra of a single battery and the comparison of the relaxation time spectra with one or more other batteries in the battery system, the diagnosis 185 of the state of the single battery and/or the overall state of the battery system. Preferably, the diagnostic unit 60 performs the diagnostic 185 method step.

The polarization contributions of n battery cells at k frequencies for a time to can be represented in matrix form:

$$B(t_0) = \begin{bmatrix} Y_{C_1}^{f_1} & \cdots & Y_{C_1}^{f_k} \\ \vdots & \ddots & \vdots \\ Y_{C_n}^{f_1} & \cdots & Y_{C_n}^{f_k} \end{bmatrix}$$

For the diagnosis of the operational and safety parameters mentioned at the beginning, a further processing of the recorded relaxation time spectra is advantageous in order to generate to generate diagnostic quantities. This is performed by the diagnostic unit 60. This processes the recorded spectra in several ways:

Statistical properties of the recorded spectra over all battery cells at the respective frequencies are calculated, such as median, mean or measure of dispersion like the Interquartile range or standard deviation. This gives a measure of the inhomogeneity of the battery state of the battery pack.

The characteristic quantities of the values of the global maximum 430, the frequency of the global maximum 430, the values of the local maxima 435, frequency of the local maxima 435, the number of the local maxima 435, the distribution of the local maxima 435 in the spectrum, the mean value of the maxima 435, the centroid of the signal, the value of the spectrum at a determined frequency 440, the value of the integral 450 of the spectrum over a particular frequency range, the integral values over several delimited frequency ranges, and the average value of the integrals over one or more delimited frequency ranges determined. The quantities from the current time step for a single battery cell or for multiple battery cells connected in series and/or in parallel are compared. Depending on the scattering measures, threshold values will be defined to detect undesired electrochemical processes, such as electrolyte and SEI decomposition and gas formation in the battery cells. As already explained with reference to FIG. 5, irreversible changes in relaxation time spectra 420 result from degeneration phenomena when a certain temperature is exceeded. By comparing the spectra between different battery cells of the battery pack, an affected battery cell or cells can be identified. For example, if battery cell A has spectrum 400 and battery cell B has spectrum 415, diagnostic unit 60 is able to identify battery cell B as a defective battery cell. Alternatively, a spectrum artificially determined from the mean and/or median of the relaxation time spectra will be used for the comparison. Alternatively or supplementarily, relaxation time spectra from previously performed measurements, for example under laboratory conditions, are used as a reference for the comparison.

A statement of the rate of change of the relaxation time spectrum over time is also used for diagnosis 185. Differentiation over time is performed using the spectra recorded in the previous time step. The process is also called trend analysis. If rapid changes are detected here, it is used in addition or as some indicator for diagnosis 185 of a critical condition. Alternatively or in addition, statistical characteristic quantities of the relaxation time spectrum, such as mean and/or median and/or standard deviation are used for trend analysis. Alternatively, for diagnostics 185 of the battery and/or the battery system, trends from previously performed measurements, for example under laboratory conditions, are used as a reference.

For the detection of slower processes, such as cell aging, a comparison with relaxation time spectra determined in the laboratory is possible to draw conclusions about the type of aging phenomena occurring. Here, a trend analysis over larger time ranges is useful.

Since spectra must be stored digitally for this purpose, a system that reduces the number of stored spectra 186 is preferred. The storage space for this can be reduced by thinning spectra over time. The spectra to be erased are selected by taking into account the operating conditions present at the time the spectrum is recorded and stored, such as charge state and temperature. If a valid spectrum is recorded at a later time under the same operating conditions as an earlier spectrum, and based on comparison with spectra recorded from other battery cells it is sufficiently certain that there is no unusual state deviation, the oldest spectrum stored for this state can, for example, be deleted from the buffer memory and the new time-stamped spectrum can be stored in the buffer memory. The procedure according to the invention reduces the memory space required for the spectrum stored for the diagnostic purposes is minimized. The reduction of the data is optionally performed by the diagnostic unit 60 or the evaluation unit 40.

LIST OF REFERENCE SIGNS 10 system control unit
15 External trigger signal
20 Excitation unit
30 Measuring unit
40 Evaluation unit
50 excitation control unit
60 Diagnostic unit
70 Transmission unit
100 Excitation signal construction
110 Generating a current excitation signal
120 Voltage response measurement
130 Drift correction
140 Frequency domain transformation.
150 Impedance spectrum determination
160 Determination of relaxation time spectrum
170 Consistency check
180 Adaptive control
185 Diagnosis
186 Memory reduction
190 Storage capacitor
200 Bidirectional power electronic converter
210 filter
220 Battery cell; battery string
300 Impedance spectrum of a battery cell at a temperature of 40° C.
310 Impedance spectrum of a battery cell at a temperature of 50° C.
320 Impedance spectrum of a battery cell at a temperature of 60° C.
330 Impedance spectrum of a battery cell at a temperature of 70° C.
340 Impedance spectrum of a battery cell at a temperature of 80° C.
350 Impedance spectrum of a battery cell at a temperature of 90° C.
360 Impedance spectrum of a battery cell at a temperature of 100° C.
370 Impedance spectrum of a battery cell at a temperature of 110° C.
380 Impedance spectrum of a battery cell at a temperature of 80° C. after previous heating up to 110° C.
390 Impedance spectrum of a battery cell at a temperature of 40° C. after previous heating up to 110° C.
400 Relaxation time spectrum of a battery at a temperature of 40° C.
402 Relaxation time spectrum of a battery at a temperature of 50° C.
405 Relaxation time spectrum of a battery at a temperature of 60° C.
410 Relaxation time spectrum of a battery at a temperature of 80° C.
415 Relaxation time spectrum of a battery at a temperature of 100° C.
420 Relaxation time spectrum of a battery at a temperature of 40° C. after previous heating up to 110° C.
430 Global maximum of a relaxation time spectrum
435 Local maximum of relaxation time spectrum
440 Value of relaxation time constant at 10 Hz
450 Integral of the relaxation time spectrum in the frequency range from 100 Hz to 1 kHz
460 Relaxation process A
465 Relaxation process B
470 Relaxation process C

The invention claimed is:

1. A method for generating an adapted excitation signal for determining a battery state or a change in a battery state of at least one battery cell by means of an impedance measurement, said method comprising steps of:
   a. applying a current excitation signal comprising at least two frequency components to the at least one battery cell;
   b. acquiring a response measurement signal of the at least one battery cell;
   c. determining at least one evaluation variable from the response measurement signal;
   d. changing at least one parameter frequency or phase position of at least one component of the current excitation signal as a function of the first response measurement signal or the at least one evaluation variable; and
   e. generating a modified current excitation signal as an adjusted excitation signal.

2. The method according to claim 1, wherein the at least one evaluation variable is given by a Kramers-Kronig residual or a signal-to-noise ratio (SNR) or wherein the at least one evaluation variable is changed if the signal-to-noise ratio of the response measurement signal for a single frequency or several frequencies or all contained frequencies is smaller than a value predetermined in a range of from about 1 dB up to about 25 dB or the at least one evaluation variable is changed if a Kramers-Kronig residual is larger than a value predetermined in a range of from about 0.2% up to about 3%.

3. The method according to claim 1, wherein:
   a parameter relative phase position of the at least one component of the current excitation signal is changed in dependence on the first response measurement signal or the at least one evaluation variable; or
   wherein the parameter frequency of the at least one component of the current excitation signal is changed in dependence on the first response measurement signal or the at least one evaluation variable; or
   wherein a parameter amplitude of at least one component of the current excitation signal is changed in dependence on the first response measurement signal or the at least evaluation variable.

4. The method according to claim 1, wherein phase positions are changed in such a way that the excitation signal has a lower crest factor or wherein the steps a. to e. are carried out several times, wherein the changed current excitation signal is in each case applied to the at least one battery cell in such a way that a mean value of the changed current excitation signal has zero mean value over at least one period of a smallest contained frequency.

5. An excitation unit for carrying out the method according to claim 1, comprising:
   a storage capacitor;
   a bidirectional power electronic converter; and
   a filter with means for charging the storage capacitor prior to the start of a measurement, wherein the storage capacitor supplies energy for applying the current excitation signal to the at least one battery cell by means of the bidirectional power electronic converter, so that energy is cyclically shifted between the storage capacitor and the battery.

6. A battery system comprising an excitation unit according to claim 5.

7. A method for determining a battery state and/or a change in a battery state of at least one battery cell, comprising steps of:
  a. applying a current excitation signal to the at least one battery cell, wherein the current excitation signal comprises at least two superimposed components each representing periodic signals with different frequencies from one another;
  b. detecting a response measurement signal of the at least one battery cell, wherein at least one impedance of the at least one battery cell is determined by means of the first response measurement signal;
  c. determining at least one evaluation variable from the first response measurement signal or the at least one impedance;
  d. changing at least one of the parameters of frequency and phase position of at least one component of the current excitation signal as a function of the response measurement signal or the at least one evaluation variable so that a measurement error is minimised;
  e. applying a modified current excitation signal to the at least one battery cell;
  f. detecting at least one further response measurement signal of the at least one battery cell, wherein at least one further impedance of the at least one battery cell is determined by means of the response measurement signal;
  g. determining at least one diagnostic variable from the determined at least one further impedance or the at least one further response measurement signal; and
  h. determining the battery state or a battery state variable of the at least one battery cell on a basis of a comparison of the at least one diagnostic variable with at least one reference value, or with at least one further diagnostic variable of the at least one battery cell or of another battery cell of a same type at a preceding time or of another battery cell of the same type from a time window with a duration such that, within the time window, the change in the state of charge of the at least one battery cell is less than 5%, or a change in the temperature is less than 5 K or a change in the capacity is less than 5% or of at most 600 seconds around the execution of step f., wherein the change in the battery state is assumed in the event of a deviation or a critical battery state is assumed when the at least one reference value is reached or exceeded.

8. The method according to claim 7, wherein the method is carried out during charging or discharging of the at least one battery cell and charging or discharging currents thereby occur, and adaptive computational compensation of charging or discharging currents in the response measurement signal takes place.

9. The method according to claim 7, wherein an impedance spectrum is checked by means of a Kramers-Kronig relation or further parameters, quality characteristics or evaluation quality, wherein at least one of the following parameters of signal-to-noise ratio, amplitude of the response measurement signal, linearity of the impedance spectrum, and time invariance of the response measurement signal is determined or used.

10. The method according to claim 7, including the following steps:
  an excitation signal construction with parameters with respect to excitation frequencies, excitation amplitudes and phase positions;
  generating a current excitation signal according to the excitation signal construction by an excitation unit or a voltage response measurement or a drift correction or a Fourier or wavelet transform in a frequency domain, in which an impedance spectrum determination and a determination of a relaxation time spectrum take place simultaneously or directly successively, or a consistency check by means of which an adaptive control of at least one of the parameters of the excitation signal construction is influenced.

11. The method according to claim 7, wherein the steps a. to g. are carried out on at least two battery cells, which are arranged within a radius of up to about 50 cm around one of the at least two battery cells simultaneously or sequentially within a predetermined measurement time window, wherein the predetermined measurement time window is defined in that a change in the state of charge of the at least two battery cells is less than 5%, a change in the temperature is less than 5 K, and a change in the capacity is less than 5%, and in step f., the diagnostic quantities of the at least two battery cells are compared.

12. The method according to claim 11, wherein the steps a. to g. are carried out on at least two battery cells which are arranged within a radius of 10 cm around one of the at least two battery cells.

13. The method according to claim 11, wherein the predetermined measurement time window is defined in that the change in the state of charge of the at least two battery cells is less than 1%.

14. The method according to claim 11, wherein the change in the temperature is less than 1 K.

15. The method according to claim 11, wherein the change in the capacity is less than 1%.

16. The method according to claim 7, wherein the steps a. to g. are carried out again when the change in the state of charge of the at least one battery cell is greater than 5%, or the change in the temperature is greater than 5 K or the change in the capacity is greater than 5%, or at a time of up to about 60 seconds, or when an external trigger signal requests a new measurement, or in that the measurement is carried out continuously with a sliding evaluation time window.

17. The method according to claim 7, wherein for a renewed execution of—step a. at least one parameter with respect to amplitude, frequency and relative phase position of frequency points of the excitation current signal, or at least one component of the changed current excitation signal from a previous measurement is selected as a starting value or for generating the excitation current signal of step a.

18. The method according to claim 7, wherein mean values or scatter measures are formed from impedances of different frequencies recorded in a respective measurement time window or simultaneously of a first battery cell and one or more further battery cells of a same type.

19. A device for carrying out the method according to claim 7, comprising:
  a system control unit;
  an excitation unit;
  a measuring unit;
  an evaluation unit;
  an excitation control unit;
  a diagnosis unit or a transmission unit;
  wherein the system control unit is set up to generate an excitation signal construction with parameters relating to excitation frequencies, excitation amplitudes, phase positions and an overall amplitude scaling, and the excitation unit is further equipped to enable adaptive procurement of the excitation signal construction, and is set up to adaptively adjust at least one of the parameters of the excitation signal construction.

* * * * *